US011977750B2

(12) United States Patent
Chodem et al.

(10) Patent No.: US 11,977,750 B2
(45) Date of Patent: May 7, 2024

(54) DETECTION AND ISOLATION OF FAULTY HOLDUP CAPACITORS USING HARDWARE CIRCUIT IN DATA STORAGE DEVICES

(71) Applicant: Western Digital Technologies, Inc., San Jose, CA (US)

(72) Inventors: Nagi Reddy Chodem, Bangalore (IN); Sergey Anatolievich Gorobets, Edinburgh (GB)

(73) Assignee: Western Digital Technologies, Inc., San Jose, CA (US)

( * ) Notice: Subject to any disclaimer, the term of this patent is extended or adjusted under 35 U.S.C. 154(b) by 86 days.

(21) Appl. No.: 17/852,103

(22) Filed: Jun. 28, 2022

(65) Prior Publication Data

US 2023/0418479 A1  Dec. 28, 2023

(51) Int. Cl.
| | |
|---|---|
| G06F 11/00 | (2006.01) |
| G06F 3/06 | (2006.01) |
| G06F 11/07 | (2006.01) |
| G06F 11/10 | (2006.01) |
| G06F 11/20 | (2006.01) |
| G11C 16/30 | (2006.01) |

(Continued)

(52) U.S. Cl.
CPC .......... *G06F 3/0625* (2013.01); *G06F 3/0655* (2013.01); *G06F 3/0679* (2013.01); *G06F 11/0793* (2013.01); *G06F 11/1048* (2013.01); *G06F 11/2015* (2013.01); *G11C 16/30* (2013.01); *G11C 29/021* (2013.01); *G11C 16/0483* (2013.01)

(58) Field of Classification Search
CPC ............. G06F 11/0793; G06F 11/1048; G06F 11/2015
See application file for complete search history.

(56) References Cited

U.S. PATENT DOCUMENTS 6,201,721 B1 * 3/2001 Suranyi .................. H02J 1/001
307/147
9,588,565 B1 * 3/2017 Harland .................. G06F 11/34
(Continued)

FOREIGN PATENT DOCUMENTS

| EP | 3428776 B1 | 12/2020 |
|---|---|---|
| KR | 102374076 B1 | 3/2022 |

*Primary Examiner* — Joshua P Lottich
(74) *Attorney, Agent, or Firm* — Morgan, Lewis & Bockius LLP (57) ABSTRACT

Disclosed are systems and methods detecting and isolating faulty hold-up capacitors and performing corrective actions for a data storage device. A hardware circuit is coupled to a micro-controller and non-volatile memory dies. The method includes, at the hardware circuit: providing a back-up power for the non-volatile memory dies and the micro-controller; and detecting whether a hold-up capacitor of the hardware circuit is faulty and isolating the hold-up capacitor in accordance with a detection that the hold-up capacitor is faulty. The method also includes, at the micro-controller: obtaining a status of an interface coupled to the hardware circuit; determining a status of the hardware circuit based on the status of the interface; and performing a corrective action for the data storage device in accordance with a determination that the status of hardware circuit corresponds to one or more faulty hold-up capacitors.

20 Claims, 5 Drawing Sheets

(51) Int. Cl.
*G11C 29/02* (2006.01)
*G11C 16/04* (2006.01)

(56) References Cited

U.S. PATENT DOCUMENTS

| | | |
|---|---|---|
| 2015/0309952 A1* | 10/2015 | Breakstone ......... G06F 13/4221 |
| | | 710/313 |
| 2016/0098328 A1* | 4/2016 | Lucas ....................... G06F 1/30 |
| | | 714/14 |
| 2018/0059761 A1 | 3/2018 | An et al. |
| 2019/0041938 A1 | 2/2019 | Zupanc et al. |
| 2022/0085645 A1 | 3/2022 | Suljic et al. |

\* cited by examiner

DETECTION AND ISOLATION OF FAULTY HOLDUP CAPACITORS USING HARDWARE CIRCUIT IN DATA STORAGE DEVICES

BACKGROUND

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state drives (SSDs), secure digital (SD) cards, and the like. A flash storage device may store control information associated with data. For example, a flash storage device may maintain control tables that include a mapping of logical addresses to physical addresses. These control tables may be used to track the physical location of logical sectors or blocks, in the flash memory. The control tables may be stored in a non-volatile memory to enable access to the stored data after a power cycle.

An enterprise SSD may include a capacitor bank to protect against unexpected power loss so as to secure user data. If one or more capacitors of the capacitor bank fail during life of the drive, there is a possibility that the drive cannot function anymore and could lead to a situation where a user is not able to read the stored information on the drive. Therefore, it is important to detect any capacitor failures as early as possible and isolate the failed capacitor as quickly as possible, and/or take any corrective actions as necessary.

The description provided in the background section should not be assumed to be prior art merely because it is mentioned in or associated with the background section. The background section may include information that describes one or more aspects of the subject technology, and the description in this section does not limit the invention.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

The present description relates in general to data storage systems and methods, and more particularly to, for example, without limitation, detection and isolation of faulty holdup capacitors using hardware circuit in data storage devices.

One or more implementations of the subject technology provide several performance benefits that improve the functionality of a computer. By detecting and isolating faulty holdup capacitors using hardware circuit in data storage devices, and by taking corrective action as needed, user data can be secured. In turn, a host computer coupled to the data storage device also receives the benefits of the data storage device's improved performance and security.

Figure 1:
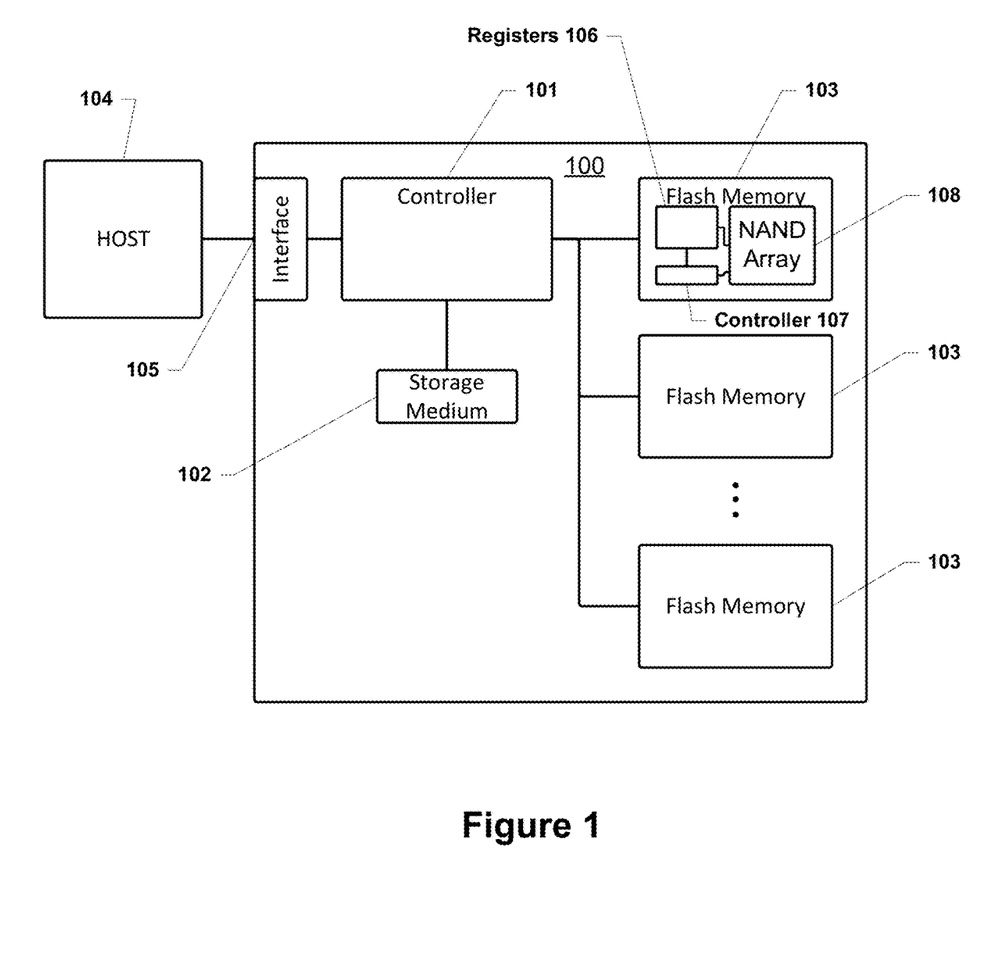
FIG. 1 is a block diagram illustrating components of an example data storage system, according to one or more embodiments.

FIG. 1 is a block diagram illustrating components of an example data storage system, according to aspects of the subject technology. A data storage system may be sometimes referred to as a system, a data storage device, a storage device, a solid-state drive, a drive, or a device. As depicted in FIG. 1, in some aspects, a data storage system 100 (e.g., a solid-state drive (SSD)) includes a data storage controller 101, a storage medium 102, and a flash memory array including one or more flash memory 103. The data storage controller 101 may be sometimes referred to as the controller 101. The controller 101 may use the storage medium 102 for temporary storage of data and information used to manage the data storage system 100. The controller 101 may include several internal components (not shown), such as a read-only memory, other types of memory, a flash component interface (e.g., a multiplexer to manage instruction and data transport along a serial connection to the flash memory 103), an input/output (I/O) interface, error correction circuitry, and the like. In some aspects, the elements of the controller 101 may be integrated into a single chip. In other aspects, these elements may be separated on their own personal computer (PC) board.

In some implementations, aspects of the subject disclosure may be implemented in the data storage system 100. For example, aspects of the subject disclosure may be integrated with the function of the data storage controller 101 or may be implemented as separate components for use in conjunction with the data storage controller 101.

The controller 101 may also include a processor that may be configured to execute code or instructions to perform the operations and functionality described herein, manage request flow and address mappings, and to perform calculations and generate commands. The processor of the controller 101 may be configured to monitor and/or control the operation of the components in the data storage controller 101. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on read-only-memory (ROM) within the controller 101 and/or its processor. One or more sequences of instructions may be software stored and read from the storage medium 102, the flash memory 103, or received from a host device 104 (e.g., via a host interface 105). ROM, the storage medium 102, the flash memory 103, represent examples of machine or computer readable media on which instructions/ code executable by the controller 101 and/or its processor may be stored. Machine or computer readable media may generally refer to any medium or media used to provide instructions to the controller 101 and/or its processor, including volatile media, such as dynamic memory used for the storage media 102 or for buffers within the controller 101, and non-volatile media, such as electronic media, optical media, and magnetic media.

In some aspects, the controller 101 may be configured to store data received from the host device 104 in the flash memory 103 in response to a write command from the host device 104. The controller 101 is further configured to read data stored in the flash memory 103 and to transfer the read data to the host device 104 in response to a read command from the host device 104. A host device 104 may be sometimes referred to as a host, a host system, or a host computer.

The host device 104 represents any device configured to be coupled to the data storage system 100 and to store data in the data storage system 100. The host device 104 may be a computing system such as a personal computer, a server, a workstation, a laptop computer, a personal digital assistant (PDA), a smart phone, or the like. Alternatively, the host device 104 may be an electronic device such as a digital camera, a digital audio player, a digital video recorder, or the like.

In some aspects, the storage medium 102 represents volatile memory used to temporarily store data and information used to manage the data storage system 100. According to aspects of the subject technology, the storage medium 102 is random access memory (RAM), such as double data rate (DDR) RAM. Other types of RAMs may be also used to implement the storage medium 102. The memory 102 may be implemented using a single RAM module or multiple RAM modules. While the storage medium 102 is depicted as being distinct from the controller 101, those skilled in the art will recognize that the storage medium 102 may be incorporated into the controller 101 without departing from the scope of the subject technology. Alternatively, the storage medium 102 may be a non-volatile memory, such as a magnetic disk, flash memory, peripheral SSD, and the like.

As further depicted in FIG. 1, the data storage system 100 may also include the host interface 105. The host interface 105 may be configured to be operably coupled (e.g., by wired or wireless connection) to the host device 104, to receive data from the host device 104 and to send data to the host device 104. The host interface 105 may include electrical and physical connections, or a wireless connection, for operably coupling the host device 104 to the controller 101 (e.g., via the I/O interface of the controller 101). The host interface 105 may be configured to communicate data, addresses, and control signals between the host device 104 and the controller 101. Alternatively, the I/O interface of the controller 101 may include and/or be combined with the host interface 105. The host interface 105 may be configured to implement a standard interface, such as a small computer system interface (SCSI), a serial-attached SCSI (SAS), a fiber channel interface, a peripheral component interconnect express (PCIe), a serial advanced technology attachment (SATA), a universal serial bus (USB), or the like. The host interface 105 may be configured to implement only one interface. Alternatively, the host interface 105 (and/or the I/O interface of controller 101) may be configured to implement multiple interfaces, which may be individually selectable using a configuration parameter selected by a user or programmed at the time of assembly. The host interface 105 may include one or more buffers for buffering transmissions between the host device 104 and the controller 101.

The flash memory 103 may represent a non-volatile memory device for storing data. According to aspects of the subject technology, the flash memory 103 includes, for example, a NAND flash memory. The flash memory 503 may include a single flash memory device or chip, or (as depicted in FIG. 1) may include multiple flash memory devices or chips arranged in multiple channels. The flash memory 103 is not limited to any capacity or configuration. For example, the number of physical blocks, the number of physical pages per physical block, the number of sectors per physical page, and the size of the sectors may vary within the scope of the subject technology.

The flash memory may have a standard interface specification so that chips from multiple manufacturers can be used interchangeably (at least to a large degree). The interface hides the inner working of the flash and returns only internally detected bit values for data. In aspects, the interface of the flash memory 103 is used to access one or more internal registers 106 and an internal flash controller 107 for communication by external devices (e.g., the controller 101). In some aspects, the registers 106 may include address, command, and/or data registers, which internally retrieve and output the necessary data to and from a NAND memory cell array 108. A NAND memory cell array 108 may be sometimes referred to as a NAND array, a memory array, or a NAND. For example, a data register may include data to be stored in the memory array 108, or data after a fetch from the memory array 108 and may also be used for temporary data storage and/or act like a buffer. An address register may store the memory address from which data will be fetched to the host device 104 or the address to which data will be sent and stored. In some aspects, a command register is included to control parity, interrupt control, and the like. In some aspects, the internal flash controller 107 is accessible via a control register to control the general behaviour of the flash memory 103. The internal flash controller 107 and/or the control register may control the number of stop bits, word length, receiver clock source, and may also control switching the addressing mode, paging control, coprocessor control, and the like.

In some aspects, the registers 106 may also include a test register. The test register may be accessed by specific addresses and/or data combinations provided at the interface of flash memory 103 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of the flash memory 103 (e.g., read levels) to dynamically vary how data is read from the memory cells of the memory arrays 108. The registers 106 may also include one or more data latches coupled to the flash memory 103.

It should be understood that in all cases data may not always be the result of a command received from the host 104 and/or returned to the host 104. In some aspects, the controller 101 may be configured to execute a read operation independent of the host 104 (e.g., to verify read levels or BER). The predicate words "configured to," "operable to,"

and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Figure 2A:
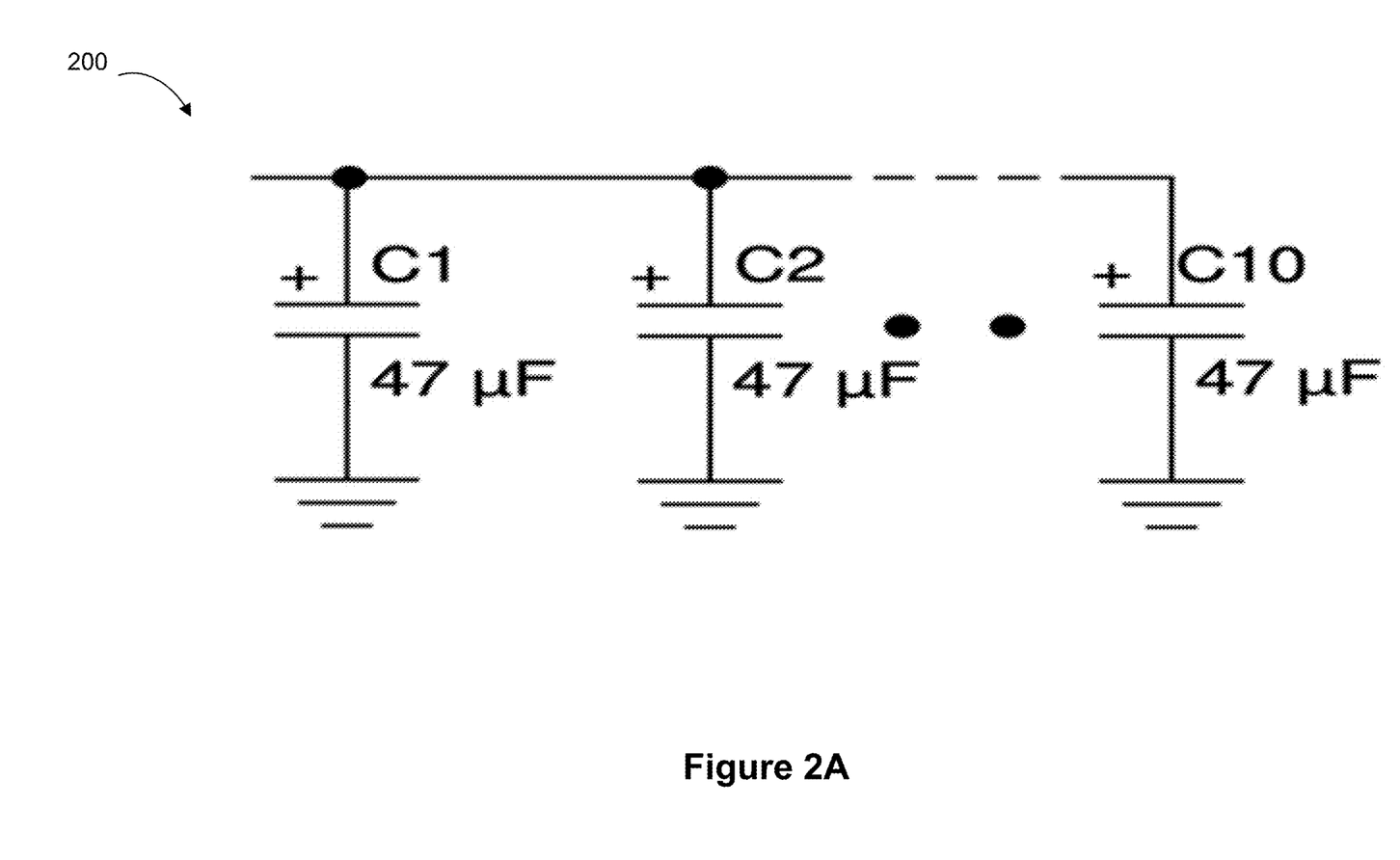
FIG. 2A shows an example capacitor bank circuit for providing power loss protection in a solid-state drive (SSD), according to one or more embodiments.

FIG. 2A shows an example capacitor bank 200 for providing power loss protection in a data storage device such as an enterprise solid-state drive (SSD), according to one or more embodiments.

In this example, capacitors C1, C2, . . . , C10 are connected in parallel. The number of capacitors and/or capacitance values of the capacitors may be determined based on the data storage device (e.g., the number of flash memories, the capacity of the data storage device) and/or the amount of power backup necessary for the device.

In some systems, firmware running on an SSD may check the health of the capacitor bank 200 at regular intervals. The frequency of health checks may be tuned. However, if these health checks are carried out too frequently, an excessive amount of central processing unit (CPU) bandwidth may be needed. This may in turn impact the throughput of the drive.

In one or more aspects, embodiments of the subject technology are directed to hardware circuits that may obviate one or more problems due to the foregoing limitations and other disadvantages. In one or more aspects, implementations of the subject technology may be used to detect and isolate failed capacitors using hardware without firmware intervention. In one or more examples, the type of the capacitor failure may be short-circuit failures.

Figure 2B:
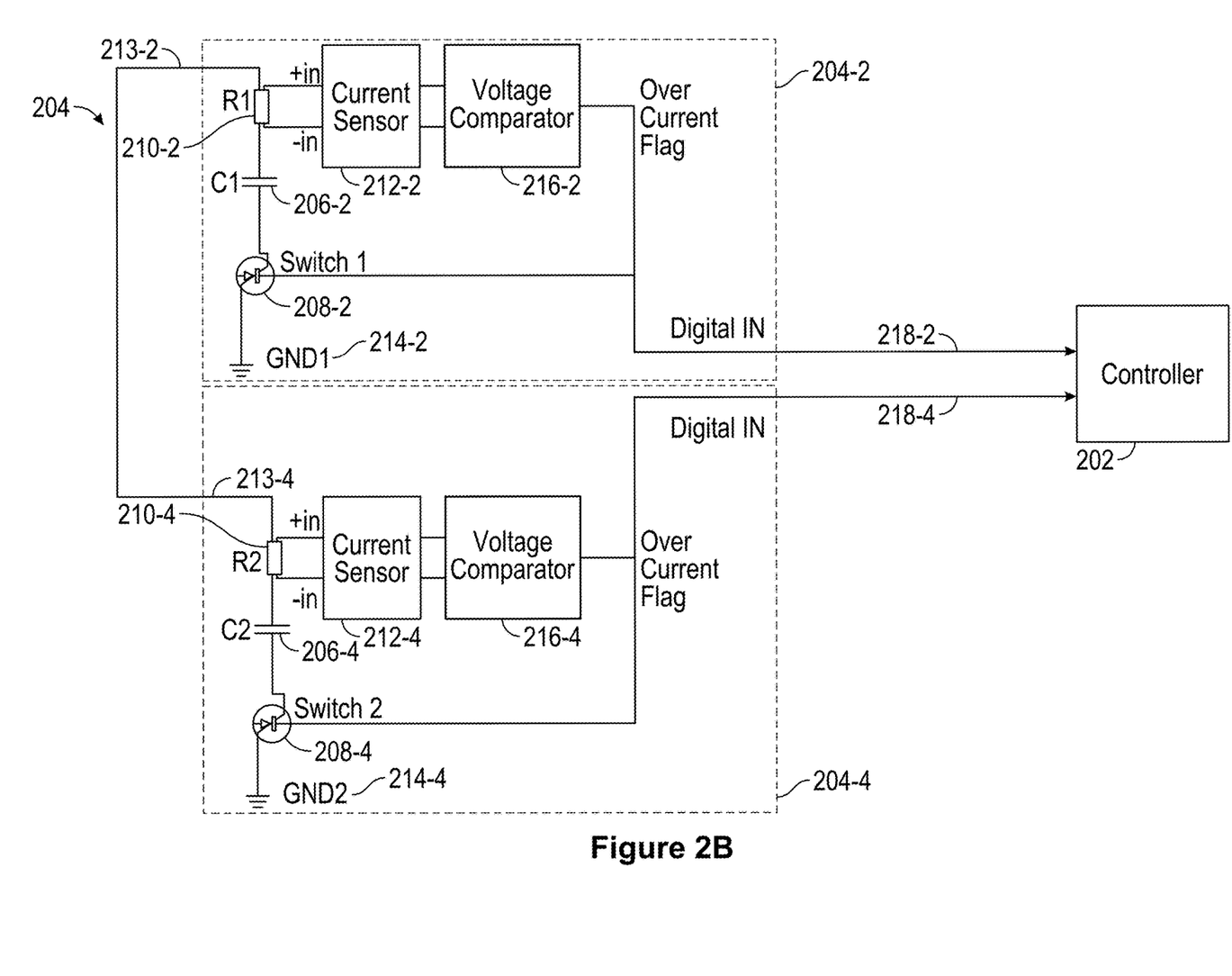
FIG. 2B shows an example of electronic components including an example circuit that may be used for detecting and isolating any faulty capacitor in a power bank used to supply back-up power to a data storage device, according to one or more embodiments.

FIG. 2B shows an example of electronic components including an example circuit 204 that may be used for detecting and isolating any faulty capacitor in a power bank used to supply back-up power to a data storage device, according to one or more embodiments.

In some aspects, a data storage device (e.g., a data storage device 100 or an enterprise solid-state drive) may include non-volatile memory (e.g., the flash memories 103) configured to store data and a hardware circuit (e.g., 204 including 204-2 and 204-4) coupled to a controller 202. The controller 202 may be sometimes referred to as a micro-controller.

In an example, a controller of FIG. 1 (e.g., 101) may include some portions or all of the controller 202 or may perform some or all of the functions of the controller 202. In another example, a controller of FIG. 1 (e.g., 101 and/or 107) may include some portions or all of the controller 202 or may perform some or all of the functions of the controller 202. In yet another example, some or all of the hardware circuit (e.g., 204) may reside outside the controller of FIG. 1 (e.g., 101 and/or 107) but within the data storage device 100. These are examples, and the subject technology is not limited to these examples.

The hardware circuit (e.g., 204 including 204-2 and 204-4) may be configured to provide a back-up power for the non-volatile memory (e.g., non-volatile memory dies) and the micro-controller. The hardware circuit may include a plurality of circuit components (e.g., 204-2 and 204-4). Each of the circuit components may include a hold-up capacitor (e.g., capacitor 206-2 or 206-4). In one or more examples, a hold-up capacitor may be a capacitor to hold charges or a capacitor to provide a back-up power supply for a data storage device in the event of an unexpected power loss to allow the device to shutdown gracefully. In one or more examples, a hold-up capacitor may be a capacitor charged from an output of a rectifier through the low resistance of the rectifier and an alternating current (AC) line. Each of the plurality of circuit components may also include a detect and isolation circuit (e.g., 210-2, 208-2, 212-2 and 216-2; or 210-4, 208-4, 212-4 and 216-4) configured to detect whether the hold-up capacitor is faulty and configured to isolate the hold-up capacitor when the hold-up capacitor is faulty.

The controller 202 may be configured to cause controlling the non-volatile memory (e.g., flash memory 103) and communicating with a host. The controller 202 may be configured to obtain status of an interface (e.g., a general purpose I/O interface; interfaces 218-2, 218-4) coupled to the plurality of circuit components. The controller 202 may also be configured to determine a status of the plurality of circuit components based on the status of the interface. The controller 202 may be configured to, in accordance with a determination that the status of the plurality of circuit components corresponds to one or more faulty hold-up capacitors, perform a corrective action for the data storage device.

In some aspects, each detect and isolation circuit may be configured to detect that its hold-up capacitor is faulty and isolate the faulty hold-up capacitor, without receiving any commands from the host or the controller for detecting or isolating the faulty hold-up capacitor (e.g., independently of the host and the controller). In some aspects, the detect and isolation circuit may be configured to perform any of these steps in real time, without being repeated with any periodicity, in a predetermined delayed manner, and/or automatically without any software or firmware instructions.

In some aspects, each detect and isolation circuit may include a sensing circuit (e.g., 212-2; 210-2 and 212-2; 212-4; or 210-4 and 212-4) configured to detect whether the hold-up capacitor (e.g., C1 206-2 or C2 206-4) is faulty and to produce an output based on detecting whether the hold-up capacitor is faulty. The detect and isolation circuit may also include a comparator circuit (e.g., 216-2 or 216-4) coupled to the sensing circuit and configured to receive the output of the sensing circuit, to compare the output of the sensing circuit to a trigger threshold value, and to produce an output of the comparator circuit based on comparing the output of the sensing circuit to the trigger threshold value. For example, the trigger threshold value may be lower than a working voltage range. If the expected voltage range is X volts, +/−5%, then the threshold may be below X-5% level. The value of X may be based on the expected current, where the current is based on the expected capacitance. The detect and isolation circuit may also include a switch circuit (e.g., 208-2 or 208-4) coupled to the comparator circuit and the hold-up capacitor and configured to be turned on or off based on the output of the comparator circuit. In some aspects, if a short-circuit fault or failure develops in the hold-up capacitor, the sensing circuit detects that the hold-up capacitor is faulty.

In some aspects, the sensing circuit may include a current sensing component. For example, the current sensing component may include a resistor (e.g., R1 210-2 or R2 210-4) connected to a current sensor (e.g., 212-2 or 212-4). The current sensing component (e.g., R1 210-2 or R2 210-4) may be connected to the corresponding hold-up capacitor (e.g., C1 206-2 or C2 206-4) in series. For example, a capacitor (e.g., 206-2) is connected to a current sensing component (e.g., R1 210-2) that is coupled to a current sensor (e.g., 212-2). In a further example, a capacitor (e.g., 206-4) is connected to a current sensing component (e.g., R2 210-4) that is coupled to a current sensor (e.g., 212-4).

In some aspects, if a short-circuit fault develops in the hold-up capacitor, a current that flows through the current sensing component is greater than a threshold current value, this current causes the output of the sensing circuit (e.g., 212-2 or 212-4) to be greater than the trigger threshold value, the output of the sensing circuit causes the output of the comparator circuit (e.g., 216-2 or 216-4) to turn off the switch circuit (e.g., 208-2 or 2084), and the turned-off switch circuit causes the hold-up capacitor (e.g., C1 206-2 or C2 206-4) to be isolated.

In some aspects, the switch circuit is coupled between the hold-up capacitor and a ground node. For example, in an example circuit shown in FIG. 2B, the switch 208-2 is coupled between the capacitor 206-2 and a ground node 214-2, and the switch 208-4 is coupled between the capacitor 206-4 and a ground node 214-4. A ground node may be sometimes referred to as a low power supply node or a first power supply node. A ground node may be configured to be connected to a ground, a low power supply voltage, or a first end of a power supply.

If the output of the sensing circuit is greater than the trigger threshold value, the output of the comparator circuit causes the switch circuit to be turned off. If the switch circuit is turned off, the hold-up capacitor is disconnected from the ground node. In some aspects, if the output of the sensing circuit is less than the trigger threshold value, the output of the comparator circuit causes the switch circuit to remain turned on. If the switch circuit remains turned on, the hold-up capacitor is not isolated, and the hold-up capacitor is coupled to the ground node through the switch circuit.

In some aspects, the plurality of circuit components may be connected in parallel, and the hold-up capacitors of the plurality of circuit components may be connected in parallel.

In some aspects, a detect and isolation circuit includes a current sensing circuit (e.g., 212-2; or 210-2 and 212-2) coupled to a hold-up capacitor (e.g., a capacitor 206-2), a voltage comparator circuit (e.g., a voltage comparator 216-2) coupled to the current sensing circuit, and a switch circuit (e.g., a switch 208-2) connected to the voltage comparator circuit and the hold-up capacitor. If the hold-up capacitor is not faulty, an output of the current sensing circuit is less than a trigger threshold value of the voltage comparator circuit, causing an output of the voltage comparator circuit to allow the switch circuit to remain in an on position. If a short-circuit fault develops in the hold-up capacitor, a current that flows through the current sensing circuit (or through at least a portion of the current sensing circuit) is greater than a threshold current value, causing the output of the current sensing circuit to be greater than the trigger threshold value of the voltage comparator circuit, causing the output of voltage comparator circuit to enable the switch circuit to turn off, and further causing the hold-up capacitor to be isolated.

In some aspects, a current sensing circuit includes a current sensing resistor (e.g., the resistor 210-2) and a current sensor (e.g., the current sensor 212-2). A first end of the current sensing resistor may be connected to the hold-up capacitor in series (e.g., one end of the resistor 210-2 is connected to the capacitor 206-2 in series). A second end of the current sensing resistor may be connected to a power supply node (e.g., 213-2), and the current sensor may be connected to the current sensing resistor in parallel (e.g., the resistor 210-2 is connected to the current sensor 212-2 in parallel). A first node of the current sensor may be coupled to the first end of the current sensing resistor, and a second node of the current sensor may be coupled to the second end of the current sensing resistor. For example, for the current sensor 212-2, a node labeled+in is connected to one end of the resistor 210-2, and a node labeled in is connected to the other end of the resistor 210-2. A power supply node (e.g., 213-2 or 213-4) may be sometimes referred to as a high power supply node or a second power supply node. A power supply node may be configured to be connected to a high power supply voltage or a second end of a power supply.

In some aspects, the data storage device may further include a host interface (e.g., the interface 105) for coupling the data storage device to the host (e.g., the host 104). The controller 202 may be configured to communicate, using the host interface, the status of the plurality of circuit components to the host.

Figure 2C:
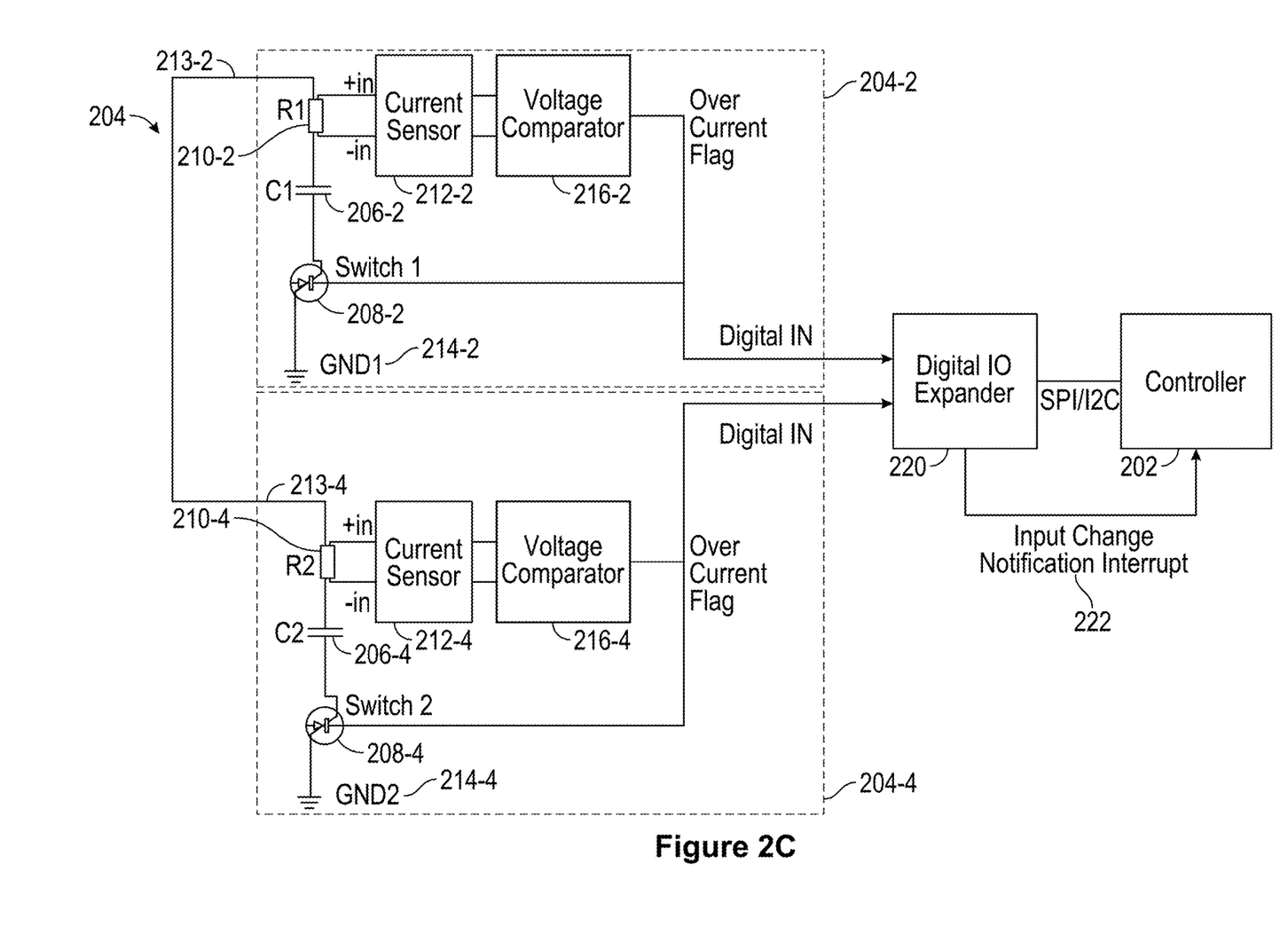
FIG. 2C shows another example of electronic components including an example circuit that may be used for detecting and isolating any faulty capacitor in a power bank used to supply back-up power to a data storage device, according to one or more embodiments.

FIG. 2C shows a second example of electronic components including the example circuit 204 that may be used for detecting and isolating any faulty capacitor in a power bank used to supply back-up power to a data storage device, according to one or more embodiments. Some of the components shown in FIG. 2C (e.g., 204 and 202) may be the same or substantially the same as those shown in FIG. 2B having the same element numbers, and thus their repetitive descriptions may be omitted for brevity.

In the example shown in FIG. 2C, a data storage device (e.g., a data storage device 100 or an enterprise solid-state drive) may further include a digital I/O expander 220 connected between the plurality of circuit components and the controller 202. The digital I/O expander may be configured to generate an interrupt (an asynchronous signal) to the controller 202 (e.g., shown as an input change notification interrupt 222) when a status of one of the plurality of circuit components changes. The controller 202 may be configured to check status of an interface between the digital I/O expander 220 and the controller 202 to determine which of the hold-up capacitors are faulty. In some aspects, the interface may include I/O nodes, the controller 202 may be configured to store statuses of the hold-up capacitors and compare statuses of the I/O nodes to the stored statuses. Each of the statuses of the hold-up capacitors may correspond to a respective one of the hold-up capacitors. Each of the statuses of the I/O nodes may correspond to a respective one of the I/O nodes.

Referring to FIGS. 2B and 2C, in some aspects, the plurality of circuit components may be configured to have a number of hold-up capacitors based on at least one of a capacity of the data storage device and a type of the data storage device. For example, triple-level cell (TLC) or quad-level cell (QLC) data storage devices may have a capacity of 1 terabyte (TB), 2 TB, 4 TB, 8 TB, 16 TB or 32 TB, and the number of hold-up capacitors may be determined based on the capacity and/or the type (e.g., TLC versus QLC) of the data storage device. Storage memory type, including the data path design, may dictate how much energy is needed to ensure that inflight data and other vulnerable data (including control information) is secured.

In some aspects, the corrective action may include ceasing to receive write commands (e.g., cease processing future commands, but complete ongoing write commands) but continuing to receive read commands from the host. Example write commands include any type of non-volatile memory express (NVMe) write protocol commands, such as NVMe write command, NVMe write-zero command, NVMe fused commands.

Still referring to FIGS. 2B and 2C, capacitors (e.g., C1 206-2 and C2 206-4) may be connected in parallel. The current sensing components (e.g., R1 210-2 and R2 210-4) may be high precision current sensing resistors. The output of a current sensing circuit, which includes the resistor and a current sensor (e.g., 210-2 and 212-2; or 210-4 and 212-4), may be connected to a voltage comparator (e.g., 216-2 or 216-4). The voltage comparator's output may be connected to a switch (e.g., 208-2 or 208-4) that is connected in series with the capacitor (e.g., C1 206-2 or C2 206-4). When a capacitor (e.g., C1 206-2 or C2 206-4) is healthy and working properly, the output of the current sensing circuit may be less than a trigger threshold of voltage comparator. Hence the output of the voltage comparator is high, and switch remain in an on position. When a short-circuit fault develops in the capacitor, a large amount of current may flow through the current sensing circuit. The output of the current sensing circuit may be higher than the trigger threshold of the voltage comparator. Hence, the output of the voltage comparator is low, and switch will be turned off. In this way, the faulty capacitor may be isolated.

In some aspects, the output of voltage comparator may be connected to a general purpose input/output (GPIO) pin of the controller 202. The firmware running on the controller may read the status of these GPIO pins and determine the status of the health of the capacitor bank (e.g., 206-2 and 206-4). If a faulty capacitor is detected, the firmware may report the status of the data storage device to a host to take appropriate action. With conventional systems, if the capacitor health checks are done infrequently, there is likely a large period of delay before a faulty capacitor is detected. The firmware may detect problems with the capacitor bank. However, with large delays, there is a possibility that the data storage device may lose power because there is not enough capacitance. This may lead to loss of user data and in some cases, this could lead to the data storage device being non-functional even after power up. The techniques and circuits described above may be used to address one or more of such problems.

Figure 3:
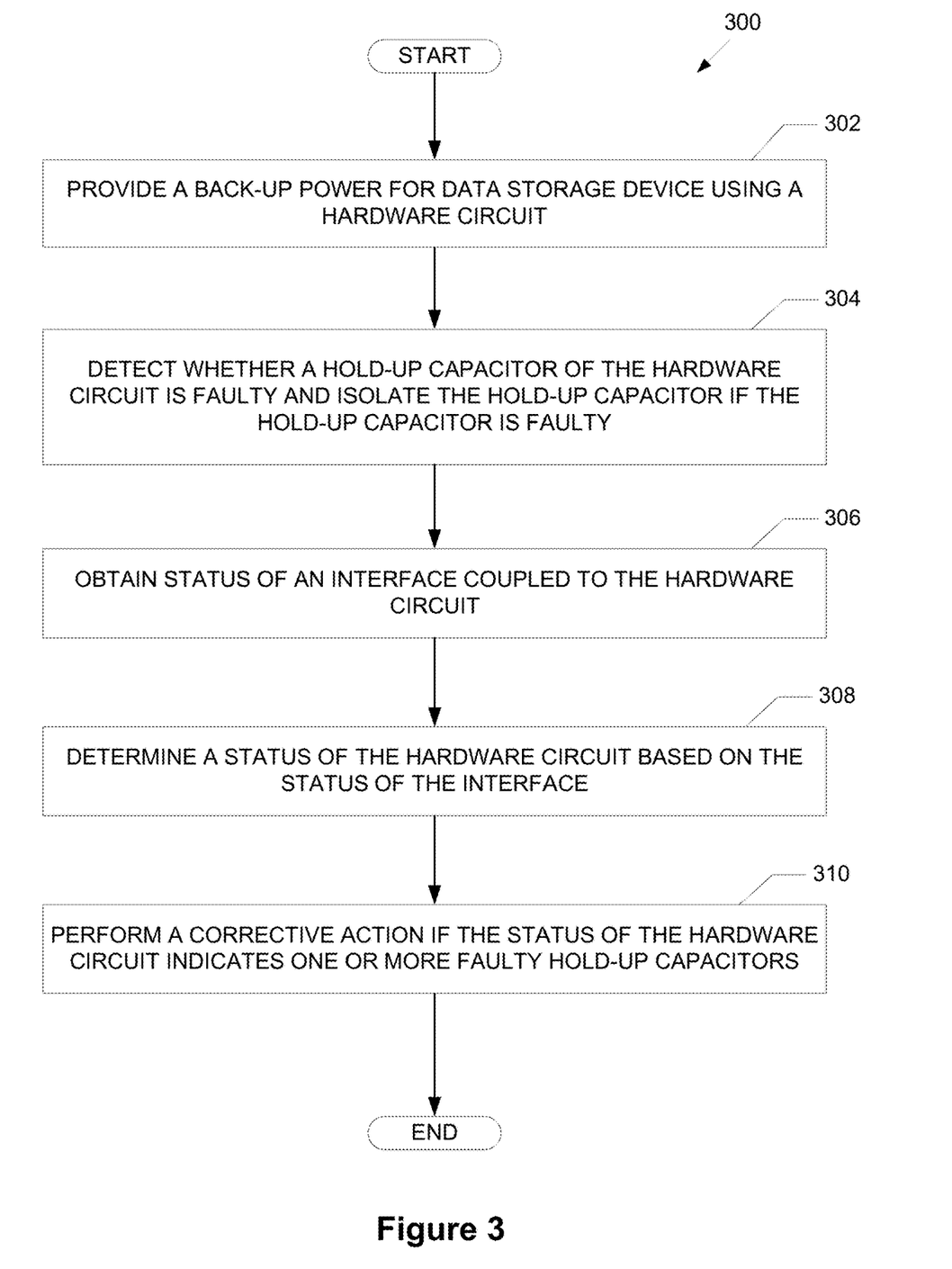
FIG. 3 is a flowchart illustrating an example process for detection and isolation of faulty holdup capacitors using a hardware circuit in a data storage device, according to one or more embodiments.

It may be instructive to describe the structures shown in FIGS. 1, 2B, and 2C with respect to FIG. 3, which is a flowchart illustrating an example process 300 for detecting and isolating faulty holdup capacitors using a hardware circuit in a data storage device, according to one or more embodiments.

Referring to FIGS. 1, 2B, 2C, and 3, a data storage system device (e.g., the data storage device 100) may include non-volatile memory (e.g., the flash memory 103), a controller (e.g., the controller 202), and a hardware circuit (e.g., 204 including 204-2 and 204-4) coupled to the non-volatile memory and the controller. The hardware circuit is configured to provide back-up power for the data storage device, which may include the non-volatile memory and the controller. (See a process 302). The hardware circuit may also be configured to detect and isolate a faulty hold-up capacitor(s) used to provide the back-up power. (See a process 304). Examples of the hardware circuit are described above in reference to FIGS. 2B and 2C, according to one or more embodiments. The process 300 may also include, at, by or for the controller (e.g., 202, 101, or 107): obtaining a status of an interface coupled to the hardware circuit (see a process 306); determining a status of the hardware circuit based on the status of the interface (see a process 308); and performing a corrective action for the data storage device in accordance with a determination that the status of hardware circuit corresponds to one or more faulty hold-up capacitors (see a process 310).

The processes 302 and 304 of FIG. 3 may be implemented in hardware and may be performed at or by, for example, a hardware circuit (e.g., 204, 204-2, 204-4, or components thereof). In one or more examples, the process 302 may be performed at or by, for example, hardware hold-up capacitors (e.g., 206-2 and 206-4). In one or more examples, the process 304 may be performed at or by, for example, a detect and isolation circuit (e.g., 210-2, 208-2, 212-2 and 216-2; or 210-4, 208-4, 212-4 and 216-4).

In one or more aspects, the process 302 is performed without using a host (e.g., 104) or a controller (e.g., 202, 101, or 107), without an intervention or an interruption by a host (e.g., 104) or a controller (e.g., 202, 101, or 107), independently of a host (e.g., 104), and/or independently of a controller (e.g., 202, 101, or 107). In one or more aspects, the process 302 is performed without using software, firmware or instructions. In one or more aspects, the process 302 is performed by hardware only. In one or more aspects, the process 302 is performed without receiving instructions or commands. In one or more aspects, the process 302 is performed without any delay or any waiting period.

In one or more aspects, the process 304 is performed without using a host (e.g., 104) or a controller (e.g., 202, 101, or 107), without an intervention or an interruption by a host (e.g., 104) or a controller (e.g., 202, 101, or 107), independently of a host (e.g., 104), and/or independently of a controller (e.g., 202, 101, or 107). In one or more aspects, the process 304 is performed without using software, firmware or instructions. In one or more aspects, the process 304 is performed by hardware only. In one or more aspects, the process 304 is performed without receiving instructions or commands. In one or more aspects, the process 304 is performed without any delay or any waiting period.

A controller (e.g., 202, 101 and/or 107) may perform some of the processes 300 of FIG. 3 (e.g., 306, 308 and 310). The controller (e.g., 202, 101 and/or 107) may cause some of the processes 300 (e.g., 306, 308 and 310) to occur, or the controller (e.g., 202, 101 and/or 107) may provide instructions to cause or facilitate the controller 107 (and the registers 106) to perform some of the processes 300 (e.g., 306, 308 and 310).

A non-transitory machine-readable medium (e.g., 102, 106, or a memory in 101) may include machine-executable instructions thereon that, when executed by a computer, machine or processor (e.g., 202, 101, or 107), perform some of the processes of FIG. 3 (e.g., 306, 308 and 310). Some of the process 300 (e.g., 306, 308 and 310) may be implemented as hardware, firmware, software, or a combination thereof.

In the examples shown in FIGS. 2B and 2C, a hardware circuit (e.g., 204) includes two circuit components (e.g., 204-2 and 204-4). It should be noted that in another example, a hardware circuit may include one circuit component rather than two circuit components. In yet another example, a hardware circuit may include more than two circuit components.

In one example, a hardware circuit (e.g., 204) is implemented using hardware components only without using any firmware or software.

Various examples of aspects of the disclosure are described below. These are provided as examples, and do not limit the subject technology.

One or more aspects of the subject technology provide a data storage device that may include non-volatile memory configured to store data, a hardware circuit, and a controller. The hardware circuit may be coupled to a controller and may be configured to provide a back-up power for the non-volatile memory and the controller. The hardware circuit may include a plurality of circuit components. Each of the plurality of circuit components may include a hold-up capacitor and a detect and isolation circuit that may be configured to detect whether the hold-up capacitor is faulty and configured to isolate the hold-up capacitor when the hold-up capacitor is faulty. The controller may be configured to cause controlling the non-volatile memory and communicating with a host. The controller may be configured to: obtain status of an interface coupled to the plurality of circuit components; determine a status of the plurality of circuit components based on the status of the interface; and, in accordance with a determination that the status of the plurality of circuit components corresponds to one or more faulty hold-up capacitors, perform a corrective action for the data storage device.

In other aspects, methods are provided for detecting and isolating faulty hold-up capacitors in a data storage device. According to some aspects, a method may be implemented using one or more hardware circuits and/or controllers for one or more data storage devices. The method may include: at a hardware circuit coupled to a controller and non-volatile memory: providing a back-up power for the non-volatile memory and the controller; and detecting whether a hold-up capacitor of the hardware circuit is faulty and isolating the hold-up capacitor if the hold-up capacitor is faulty. The method may include, at the controller: obtaining a status of an interface coupled to the hardware circuit; determining a status of the hardware circuit based on the status of the interface; and performing a corrective action for the data storage device in accordance with a determination that the status of hardware circuit corresponds to one or more faulty hold-up capacitors.

In further aspects, a system may include: a first means for (i) providing a back-up power for non-volatile memory and detecting and (ii) isolating a faulty hold-up capacitor; a second means for obtaining a status of an interface coupled to the first means; a third means for determining a status of the first means based on the status of the interface; and a fourth means for performing a corrective action in accordance with a determination that the status of the first means corresponds to one or more faulty hold-up capacitors.

Disclosed are systems and methods providing detecting and isolating faulty hold-up capacitors in a data storage device. Thus, the described methods and systems provide performance benefits that improve the functioning of a storage device.

It is understood that other configurations of the subject technology will become readily apparent to those skilled in the art from the detailed description herein, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

When an element is "connected" or "coupled" to another element, the element can not only be directly connected or coupled to another element, but also be indirectly connected or coupled to another element with one or more intervening elements disposed or interposed between the elements, unless otherwise specified.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A data storage device, comprising:
    non-volatile memory configured to store data;
    a hardware circuit coupled to a controller and configured to provide a back-up power for the non-volatile memory and the controller, the hardware circuit comprising a plurality of circuit components, each of the plurality of circuit components comprising:
        a hold-up capacitor; and
        a detect and isolation circuit configured to detect whether the hold-up capacitor is faulty and configured to isolate the hold-up capacitor when the hold-up capacitor is faulty; and
    the controller configured to cause controlling the non-volatile memory and communicating with a host, the controller configured to:
        obtain a status of an interface coupled to the plurality of circuit components;
        determine a status of the plurality of circuit components based on the status of the interface; and
        in accordance with a determination that the status of the plurality of circuit components corresponds to one or more faulty hold-up capacitors, perform a corrective action for the data storage device.

2. The data storage device of claim 1, wherein the detect and isolation circuit is configured to detect that the hold-up capacitor is faulty and isolate the faulty hold-up capacitor, without receiving any commands from the host or the controller for detecting or isolating the faulty hold-up capacitor.

3. The data storage device of claim 1, wherein:
    the detect and isolation circuit comprises:
        a sensing circuit configured to detect whether the hold-up capacitor is faulty and to produce an output based on detecting whether the hold-up capacitor is faulty;
        a comparator circuit coupled to the sensing circuit and configured to receive the output of the sensing circuit, to compare the output of the sensing circuit to a trigger threshold value, and to produce an output of the comparator circuit based on comparing the output of the sensing circuit to the trigger threshold value; and
        a switch circuit coupled to the comparator circuit and the hold-up capacitor and configured to be turned on or off based on the output of the comparator circuit.

4. The data storage device of claim 3, wherein when a short-circuit fault develops in the hold-up capacitor, the sensing circuit is configured to detect that the hold-up capacitor is faulty.

5. The data storage device of claim 3, wherein:
    the sensing circuit comprises a current sensing component;
    the current sensing component is connected to the hold-up capacitor in series; and
    when a short-circuit fault develops in the hold-up capacitor, a current that flows through the current sensing component is greater than a threshold current value, this current causes the output of the sensing circuit to be greater than the trigger threshold value, the output of the sensing circuit causes the output of the comparator circuit to turn off the switch circuit, and the turned-off switch circuit causes the hold-up capacitor to be isolated.

6. The data storage device of claim 3, wherein:
    the switch circuit is coupled between the hold-up capacitor and a first power supply node;
    when the output of the sensing circuit is greater than the trigger threshold value, the output of the comparator circuit causes the switch circuit to be turned off; and
    when the switch circuit is turned off, the hold-up capacitor is disconnected from the first power supply node.

7. The data storage device of claim 3, wherein:
    the switch circuit is coupled between the hold-up capacitor and a first power supply node;
    when the output of the sensing circuit is less than the trigger threshold value, the output of the comparator circuit causes the switch circuit to remain turned on; and
    when the switch circuit remains turned on, the hold-up capacitor is not isolated, and the hold-up capacitor is coupled to the first power supply node through the switch circuit.

8. The data storage device of claim 1, wherein:
    the plurality of circuit components are connected in parallel; and
    the hold-up capacitors of the plurality of circuit components are connected in parallel.

9. The data storage device of claim 1, wherein the detect and isolation circuit comprises:
    a current sensing circuit coupled to the hold-up capacitor;
    a voltage comparator circuit coupled to the current sensing circuit; and
    a switch circuit connected to the voltage comparator circuit and the hold-up capacitor.

10. The data storage device of claim 9, wherein:
    when the hold-up capacitor is not faulty, an output of the current sensing circuit is less than a trigger threshold value of the voltage comparator circuit, causing an output of the voltage comparator circuit to allow the switch circuit to remain in an on position; and
    when a short-circuit fault develops in the hold-up capacitor, a current that flows through the current sensing circuit is greater than a threshold current value, causing the output of the current sensing circuit to be greater than the trigger threshold value of the voltage comparator circuit, causing the output of voltage comparator circuit to enable the switch circuit to turn off, and causing the hold-up capacitor to be isolated.

11. The data storage device of claim 9, wherein:
the current sensing circuit comprises a current sensing resistor and a current sensor;
a first end of the current sensing resistor is connected to the hold-up capacitor in series;
a second end of the current sensing resistor is connected to a second power supply node; and
the current sensor is connected to the current sensing resistor in parallel, wherein a first node of the current sensor is coupled to the first end of the current sensing resistor, and a second node of the current sensor is coupled to the second end of the current sensing resistor.

12. The data storage device of claim 1, further comprising:
a host interface for coupling the data storage device to the host, wherein the controller configured to perform the corrective action comprises the controller configured to communicate, using the host interface, the status of the plurality of circuit components to the host.

13. The data storage device of claim 1, further comprising:
a digital I/O expander connected between the plurality of circuit components and the controller, wherein the digital I/O expander is configured to generate an interrupt to the controller when a status of one of the plurality of circuit components changes, wherein the controller is configured to check status of an interface between the digital I/O expander and the controller to determine which of the hold-up capacitors are faulty.

14. The data storage device of claim 13, wherein:
the interface comprises I/O nodes;
the controller is configured to store statuses of the hold-up capacitors and compare statuses of the I/O nodes to the stored statuses;
each of the statuses of the hold-up capacitors corresponds to a respective one of the hold-up capacitors; and
each of the statuses of the I/O nodes corresponds to a respective one of the I/O nodes.

15. The data storage device of claim 1, wherein the plurality of circuit components is configured to have a number of hold-up capacitors based on at least one of a capacity of the data storage device and a type of the data storage device.

16. The data storage device of claim 1, wherein the corrective action comprises ceasing to receive write commands but continuing to receive read commands from the host.

17. A method for detecting and isolating faulty hold-up capacitors in a data storage device, the method comprising:
at a hardware circuit coupled to a controller and non-volatile memory:
providing a back-up power for the non-volatile memory and the controller; and
detecting whether a hold-up capacitor of the hardware circuit is faulty and isolating the hold-up capacitor if the hold-up capacitor is faulty; and
at the controller:
obtaining a status of an interface coupled to the hardware circuit;
determining a status of the hardware circuit based on the status of the interface; and
performing a corrective action for the data storage device in accordance with a determination that the status of the hardware circuit corresponds to one or more faulty hold-up capacitors.

18. The method of claim 17, wherein the hardware circuit detects that the hold-up capacitor is faulty and isolates the faulty hold-up capacitor, without receiving any commands from the controller or a host coupled to the data storage device.

19. The method of claim 17, wherein the corrective action comprises ceasing to receive write commands but continuing to receive read commands from a host coupled to the data storage device.

20. A system, comprising:
a hardware circuit;
a first means for providing a back-up power for non-volatile memory and for detecting and isolating a faulty hold-up capacitor;
a second means for obtaining a status of an interface coupled to the first means;
a third means for determining a status of the first means based on the status of the interface; and
a fourth means for performing a corrective action in accordance with a determination that the status of the first means corresponds to one or more faulty hold-up capacitors.

* * * * *